(12) United States Patent
Fu et al.

(10) Patent No.: US 10,692,900 B1
(45) Date of Patent: Jun. 23, 2020

(54) METHOD OF MANUFACTURING ARRAY SUBSTRATE AND DISPLAY PANEL

(71) Applicant: HKC CORPORATION LIMITED, Shenzhen, Guangdong (CN)

(72) Inventors: Tingting Fu, Guanggong (CN); Bangtong Ge, Guanggong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 16/315,599

(22) PCT Filed: Dec. 7, 2018

(86) PCT No.: PCT/CN2018/119706
§ 371 (c)(1),
(2) Date: Jan. 4, 2019

(30) Foreign Application Priority Data

Nov. 14, 2018 (CN) .......................... 2018 1 1352465

(51) Int. Cl.
| | |
|---|---|
| H01L 27/12 | (2006.01) |
| H01L 21/3213 | (2006.01) |
| H01L 21/3065 | (2006.01) |
| H01L 21/285 | (2006.01) |
| H01L 29/417 | (2006.01) |
| H01L 29/45 | (2006.01) |
| H01L 21/311 | (2006.01) |
| H01L 21/02 | (2006.01) |
| H01L 29/40 | (2006.01) |
| H01L 21/027 | (2006.01) |
| H01L 29/66 | (2006.01) |
| H01L 29/786 | (2006.01) |

(52) U.S. Cl.
CPC ...... *H01L 27/1288* (2013.01); *H01L 21/0262* (2013.01); *H01L 21/0273* (2013.01); *H01L 21/02274* (2013.01); *H01L 21/02532* (2013.01); *H01L 21/2855* (2013.01); *H01L 21/28556* (2013.01); *H01L 21/3065* (2013.01); *H01L 21/31116* (2013.01); *H01L 21/32133* (2013.01); *H01L 27/124* (2013.01); *H01L 29/401* (2013.01); *H01L 29/41733* (2013.01); *H01L 29/458* (2013.01); *H01L 29/66765* (2013.01); *H01L 29/78669* (2013.01); *H01L 29/78678* (2013.01)

(58) Field of Classification Search
None
See application file for complete search history.

(56) References Cited

U.S. PATENT DOCUMENTS

| | | | | |
|---|---|---|---|---|
| 2011/0068341 | A1* | 3/2011 | Li | H01L 27/12 257/59 |
| 2018/0315805 | A1* | 11/2018 | Liu | H01L 27/3262 |

* cited by examiner

*Primary Examiner* — Jack S Chen

(57) ABSTRACT

A method of manufacturing array substrate and a display panel, wherein, the method of manufacturing array substrate includes: depositing a gate electrode, a gate insulation layer, a semiconductor layer, a metal layer and a photoresist; forming an non-exposure area, a partial exposure area and a full exposure area through exposure and developing; then, performing a first ashing treatment and a wet etching to form a metal layer recess, and performing a second ashing treatment to etch off residual photoresist which remains in the metal layer recess after the first ashing treatment; and finally performing a dry etching to form a pattern of a channel region.

15 Claims, 6 Drawing Sheets

METHOD OF MANUFACTURING ARRAY SUBSTRATE AND DISPLAY PANEL

CROSS-REFERENCE TO RELATED APPLICATION

This application is the PCT Application No. PCT/CN2018/119706 for entry into US national phase, with an international filing date of Dec. 7, 2018 designating US, now pending, and claims priority to Chinese Patent Application No. 201811352465.8, filed with China National Intellectual Property Administration on Nov. 14, 2018, and titled "method of manufacturing array substrate, display panel and display device", the content of which is incorporated herein by reference in entirety.

TECHNICAL FIELD

The present disclosure pertains to the technical field of display device, and more particularly to a method of manufacturing array substrate and a display panel.

BACKGROUND

The statements herein provide background information related to the present application without necessarily constituting the prior art. With the development of science and technology, electronic equipment (e.g., a smart phone, a notebook computer, a digital camera and the like) are becoming more and more popular, such that the demand of liquid crystal display device which serves as an important component of electronic equipment is greatly improved, and a rapid development of liquid crystal display panel industry is promoted.

In the display panel manufacturing industry, a photoetching mask is a critical component in a photoetching process, by exposing a pattern coated with photoresist through UV and photoetching mask, such that the pattern of electronic equipment on the photoetching mask may be transferred to a substrate, and then the electronic equipment is formed through the processes including developing, etching and stripping.

However, in the photoetching process, due to the fact that there is a characteristic size deviation between the photoresist and the metal layer deposited on the substrate (i.e., a deviation between a design value and an actual value), a subsequent etching process is influenced, and an electrical performance of an array panel is further influenced.

SUMMARY

An object of the present disclosure is to provide a method of manufacturing array substrate, which solves technical problems including but is not limited to a technical problem that the electrical performance of the array panel is influenced due to the fact that there is the characteristic size deviation between the photoresist and the metal layer.

A method of manufacturing array substrate, including steps of:

sequentially forming a gate electrode, a gate insulation layer, a semiconductor layer and a metal layer on a substrate;

coating a photoresist on the metal layer and forming an non-exposure area, a partial exposure area and a full exposure area through exposure and developing;

performing a first ashing treatment to remove photoresist in the partial exposure area and uncover the metal layer corresponding to the partial exposure area;

performing a wet etching to the uncovered metal layer of the partial exposure area to form a metal layer recess and uncover the semiconductor layer;

performing a second ashing treatment to etch off residual photoresist which remains in the metal layer recess after the first ashing treatment; and performing a dry etching to form a pattern of a thin film transistor channel region.

Another object of the present disclosure is to provide a method of manufacturing array substrate, including steps of:

sequentially forming a gate electrode, a gate insulation layer, a semiconductor layer and a metal layer on a substrate;

coating a layer of photoresist on the metal layer and forming an non-exposure area, a partial exposure area and a full exposure area through exposure and developing;

performing a first ashing treatment to remove photoresist in the partial exposure area and uncover the metal layer corresponding to the partial exposure area;

performing a wet etching to the uncovered metal layer of the partial exposure area to form a metal layer recess and uncover the semiconductor layer;

performing a second ashing treatment to etch off residual photoresist which remains in the metal layer recess after the first ashing treatment; and performing a dry etching to form a pattern of a thin film transistor channel region;

where sulfur hexafluoride gas etching is applied in the first ashing treatment and in the second ashing treatment.

Another object of the present disclosure is to provide a display panel, including an array substrate and a color film substrate, where the array substrate includes a substrate, a gate electrode, a gate insulation layer, a semiconductor layer, a metal layer and a photoresist stacked on the substrate sequentially; where a channel is formed on the photoresist, the metal layer is provided thereon with a metal layer recess configured to communicate with the channel and uncover the semiconductor layer; and two side walls of the metal layer recess are flush with two side walls of the channel.

In the method of manufacturing array substrate provided by the embodiments of the present disclosure, the residual photoresist which remains in the metal layer recess area after the first ashing treatment is further etched away through the second ashing treatment, that is, a coverage amount of the residual photoresist which remains in the metal layer recess after the first ashing treatment is reduced in a transverse direction, so that the photoresist is guaranteed to be flush with an edge of the metal layer, a size deviation between the metal layer and the photoresist is reduced, and the subsequent etching process is guaranteed, and therefore aligning the subsequent semiconductor with the metal layer is implemented.

BRIEF DESCRIPTION OF THE DRAWINGS

In order to explain this embodiments of the present disclosure more clearly, a brief introduction regarding the accompanying drawings that need to be used for describing this embodiments is given below; it is obvious that the accompanying drawings described as follows are only some embodiments of the present disclosure, for ordinarily skilled one in the art, other drawings may also be obtained according to the current drawings on the premise of paying no creative labor.

DESCRIPTION OF THIS EMBODIMENTS

In order to make the purpose, the technical solution and the advantages of the present disclosure be clearer and more understandable, the present disclosure is further described in detail below with reference to accompanying figures and embodiments. It should be understood that the specific embodiments described herein are merely intended to illustrate but not to limit the present disclosure.

It should be noted that, when one component is described to be "fixed to" or "arranged on" another component, this component may be directly or indirectly arranged on another component. When one component is described to be "connected with" another component, it may be directly or indirectly connected to the other component. Orientation or position relationships indicated by terms including "upper", "lower", "left" and "right" are based on the orientation or position relationships shown in the accompanying figures and is only used for the convenience of description, instead of indicating or implying that the indicated device or element must have a specific orientation and is constructed and operated in a particular orientation, and thus should not be interpreted as limitation to the present disclosure. For the person of ordinary skill in the art, the specific meanings of the aforesaid terms may be interpreted according to specific conditions. Terms of "the first" and "the second" are only for the purpose of describing conveniently and should not be interpreted as indicating or implying relative importance or impliedly indicating the number of indicated technical features. "Multiple/a plurality of" means two or more unless there is an additional explicit and specific limitation.

In order to explain the technical solution of the present disclosure, a detailed description will be given below with reference to the specific accompanying figures and the embodiments.

Figure 1:
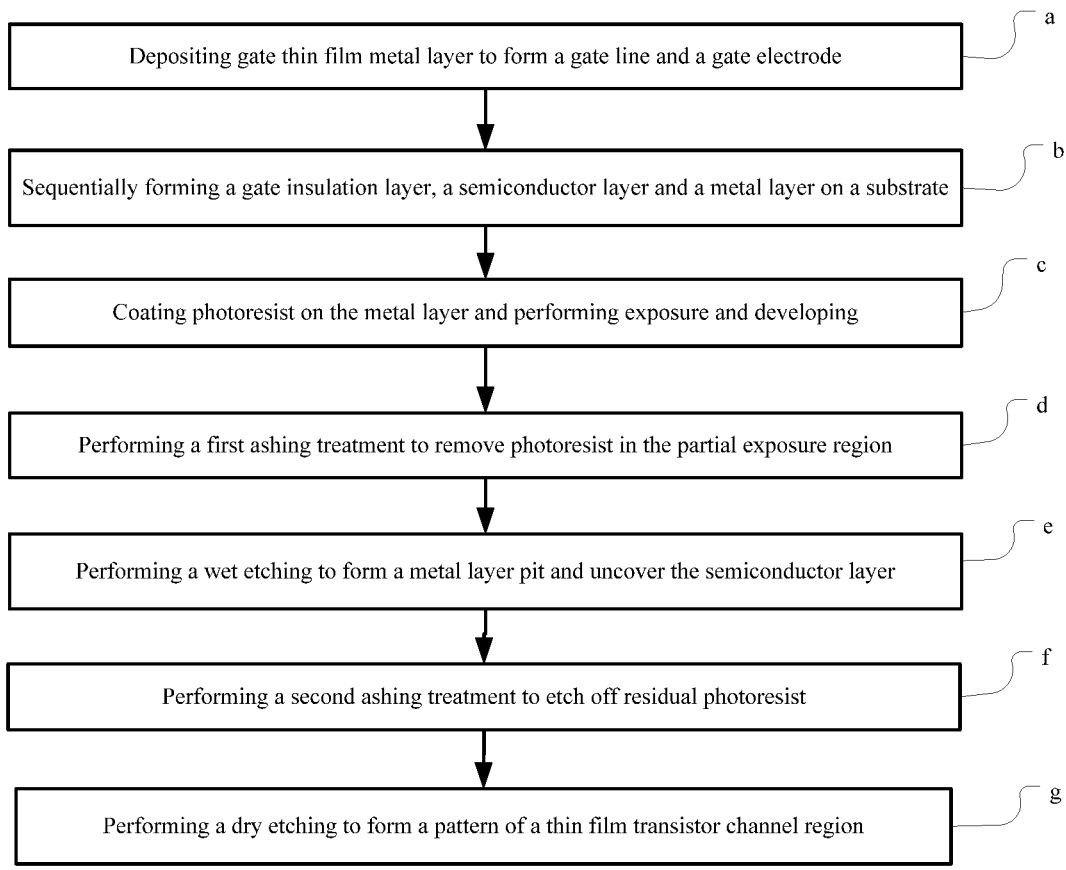
FIG. 1 illustrates a flowchart of a method of manufacturing an array substrate provided by an embodiment of the present disclosure.
Figure 2:
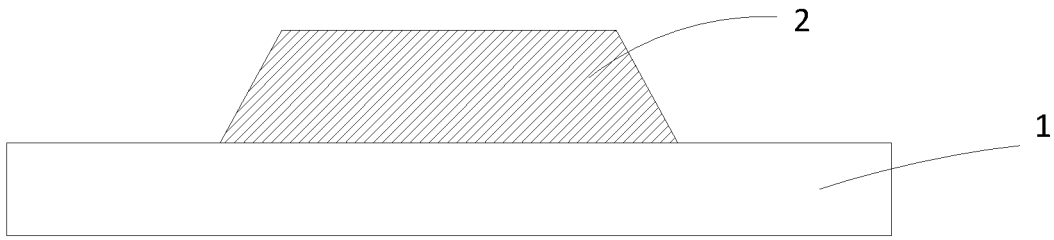
FIG. 2 illustrates a structural schematic diagram of depositing a gate metal thin film layer on a substrate provided by an embodiment of the present disclosure.
Figure 3:
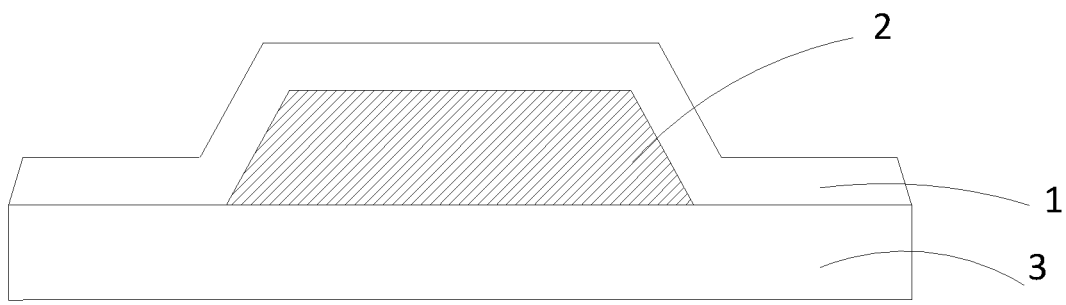
FIG. 3 illustrates a structural schematic diagram of depositing a gate insulation layer on the substrate provided by an embodiment of the present disclosure.
Figure 4:
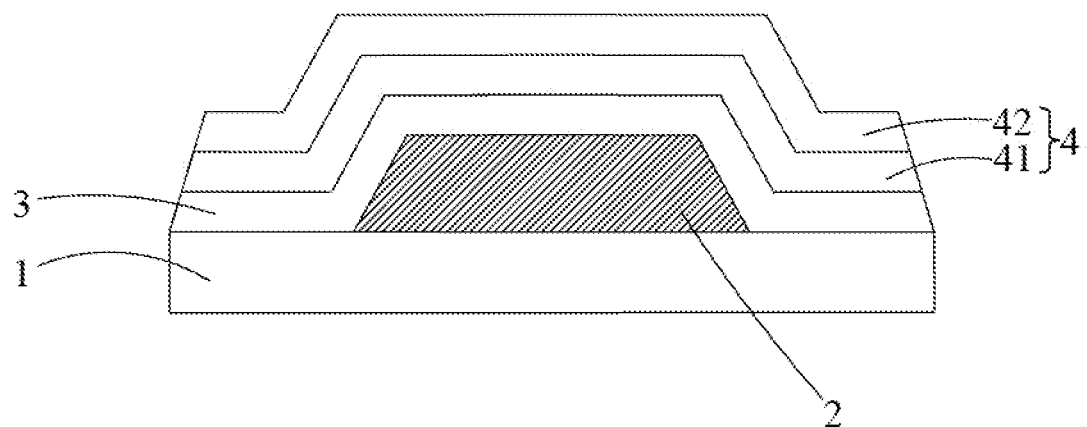
FIG. 4 illustrates a structural schematic diagram of depositing a semiconductor layer on the substrate provided by an embodiment of the present disclosure.
Figure 5:
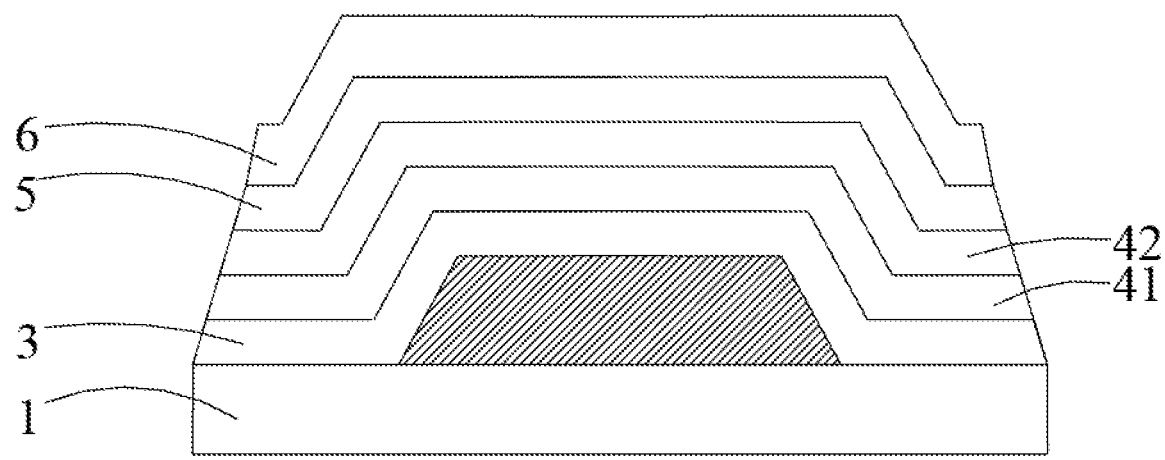
FIG. 5 illustrates a structural schematic diagram of depositing a metal layer on the substrate provided by an embodiment of the present disclosure.

As shown in FIGS. 1-8, this embodiment of the present disclosure provides a method of manufacturing an array substrate, which includes following steps of:

sequentially forming a gate electrode 2, a gate insulation layer 3, a semiconductor layer 4 and a metal layer 5 on a substrate 1, which corresponds to a step a and a step b in FIG. 1;

coating a layer of photoresist 6 on the metal layer 5; forming an non-exposure area A, a partial exposure area B and a full exposure area C through exposure and developing; which corresponds to a step c in FIG. 1;

performing a first ashing treatment to remove the photoresist 6 of the partial exposure area B and uncover a metal layer 5 corresponding to the partial exposure area B; which corresponds to a step d in FIG. 1;

performing wet etching treatment to the metal layer 5 of the partial exposure area B to form a metal layer recess 50 and uncover the semiconductor layer 4; which corresponds to a step e in FIG. 1;

performing a second ashing treatment to etch off the residual photoresist 61 which remains in the metal layer recess area after the first ashing treatment; which corresponds to the step f in FIG. 1; and performing a dry etching to form a pattern of a thin film transistor channel region; which corresponds to a step g in FIG. 1.

Figure 6:
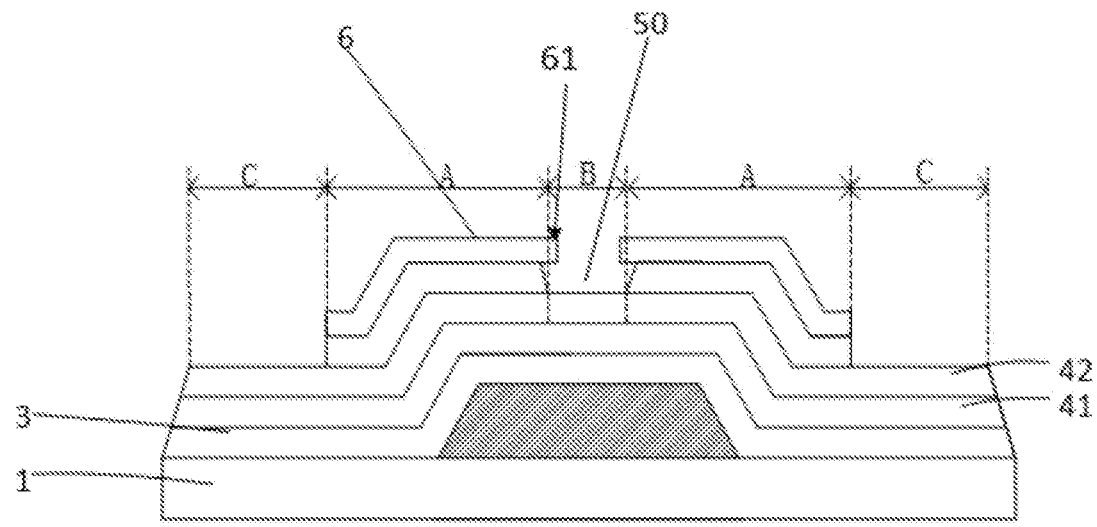
FIG. 6 illustrates a structural schematic diagram of the array substrate after a fist ashing treatment and a wet etching provided by an embodiment of the present disclosure.
Figure 7:
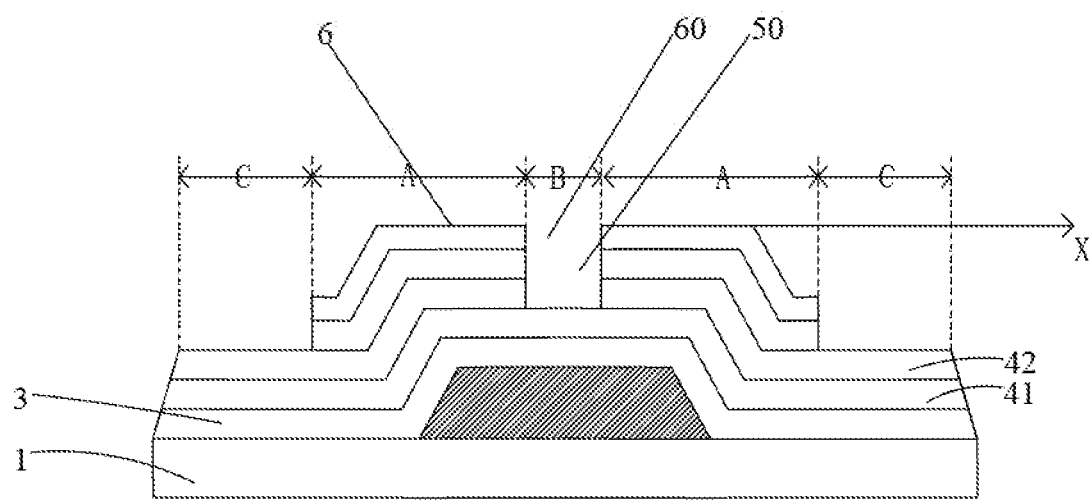
FIG. 7 illustrates a structural schematic diagram of the array substrate after a second ashing treatment provided by an embodiment of the present disclosure.

In this embodiment, referring to FIG. 6 and FIG. 7, a halftone or grey tone mask is used for exposure, so that the photoresist 6 forms a full exposure area C (i.e., the area where the photoresist is completely removed), a partial exposure area B (the area where the photoresist is partially removed), and an non-exposure area A (the area where the photoresist is completely retained); in this way, the photoresist 6 of the partial exposure area B is removed according to the first ashing treatment, and the metal layer 5 corresponding to the partial exposure area B is uncovered; the metal layer 5 of the partial exposure area B is etched to form a metal layer recess 50 through wet etching treatment, and a semiconductor layer 4 is uncovered; due to the fact that the photoresist 6 which is arranged above the metal layer recess 50 is not completely removed after the first ashing treatment; therefore, the residual photoresist 6 which remains in the metal layer recess area after the first ashing treatment needs to be further etched away through the second ashing treatment, that is, a coverage amount of the residual photoresist 6 which remains in the metal layer recess 50 after the first ashing treatment is reduced in a transverse direction, and the photoresist 6 is guaranteed to be flush with an edge of the metal layer 5, a size deviation between the metal layer 5 and the photoresist 6 is reduced, and a subsequent etching process is guaranteed. Of course, in this embodiment, the preparation method is not limited to the sequence mentioned above, and is not solely limited herein.

In one or more embodiments, as shown in FIG. 7, where x in FIG. 7 represents the transverse direction of the photoresist 6 as described above.

In one or more embodiments, oxygen or sulfur hexafluoride gas may be used for etching in the second ashing treatment, such that the photoresist 6 may be well etched.

Optionally, oxygen or sulfur hexafluoride gas may also be used for etching in the first ashing treatment, such that the photoresist 6 may be well etched.

Certainly, in this embodiment, other gases may also be used for etching in the first ashing treatment or in the second ashing treatment, which is not solely limited herein.

In one or more embodiments, the semiconductor layer 4 includes a silicon-based thin film layer 41 and an ohmic contact layer 42, and the ohmic contact layer 42 is deposited on the silicon-based thin film layer 41. Optionally, the ohmic contact layer 42 may be deposited on the silicon-based thin film layer 41 through a chemical vapor deposition method; of course, in this embodiment, the ohmic contact layer 42 may also be deposited on the silicon-based thin film layer 41 through a physical vapor deposition method, which is not solely limited herein.

In one or more embodiments, after the step of performing the second ashing treatment to etch off the residual photoresist corresponding to the metal layer recess area, the method of manufacturing array substrate further includes following steps of:

performing a dry etching to etch off the ohmic contact layer 42 uncovered in the metal layer recess 50, such that the silicon-based thin film layer 41 is uncovered in the partial exposure area B to form a pattern of TFT (Thin Film Transistor) channel region. In this way, by arranging the second ashing treatment before the dry etching, so that redundant photoresist 6 in the metal layer recess 50 may be etched away; when dry etching is performed, the semiconductor layer 4 in the uncovered metal layer recess 50 may be completely etched away, such that the semiconductor layer 4 is flush with the edge of the metal layer 5, and an influence on an electrical performance of the array substrate due to dimension deviation is reduced.

Optionally, referring to table 1, table one reflects the influences of different gases on etching of the ohmic contact layer 42 in the metal layer recess 50 in the ashing treatment. By comparison, it can be obviously seen that, under the same condition, there may be fewer residual amount of the ohmic contact layer 42 in the metal layer recess 50 through the ashing treatment; besides, under the same condition, compared with oxygen etching, using of sulfur hexafluoride gas etching enables fewer residual amount of the ohmic contact layer 42 in the metal layer recess 50, such that the display panel has better display characteristics.

Table one reflects the influences of different gases on the etching of ohmic contact layer 42 in the metal layer recesss 50 in the ashing treatment.

| Processing condition | Residual amount of ohmic contact layer/micrometer |
| --- | --- |
| Ashless treatment | 0.5821 |
| Ashing treatment (Oxygen etching) | 0.196 |
| Ashing treatment (sulfur hexafluoride etching) | 0.0992 |

Optionally, referring to table 2, table 2 reflects the influences of different time on etching of semiconductor in the metal layer recess 50 under oxygen etching. By comparison, it can be obviously seen that, under the same condition, when etching time is longer, the residual amount of the ohmic contact layer 42 in the metal layer recess 50 is gradually reduced, when ventilation time reaches 60 seconds, the effect is excellent, so that the residual amount of the ohmic contact layer 42 may reach 0.069 microns, aligning the edge of the ohmic contact layer 42 with the edge of the metal layer 5 may be almost implemented, and the influence on the electric property of the array substrate due to existence of residual amount of the ohmic contact layer 42 is avoided.

Table two reflects the influences of different time on etching of the ohmic contact layer 42 in the metal layer recess 50 under oxygen etching.

| Time/second | Residual amount of the ohmic contact layer/micrometer |
| --- | --- |
| 20 | 0.196 |
| 40 | 0.0917 |
| 60 | 0.0769 |

Optionally, referring to table three, table three reflects the influences of different time on etching of the ohmic contact layer 42 in the metal layer recess 50 under sulfur hexafluoride gas etching. By comparison, it can be obviously seen that, under the same condition, when the etching time is longer, the residual amount of the ohmic contact layer 42 in the metal layer recess 50 is gradually reduced; when the ventilation time reaches 20 seconds, the effect is excellent, such that the residual amount of the ohmic contact layer 42 reaches 0.0992 microns, which guarantees that the edge of the ohmic contact layer 42 is flush with the edge of the metal layer 5.

Table three reflects the influences of different time on the etching of the ohmic contact layer 42 in the metal layer recess 50 under etching of sulfur hexafluoride gas.

| Time/second | Residual amount of the ohmic contact layer/micrometer |
| --- | --- |
| 10 | 0.1365 |
| 20 | 0.0992 |

Alternatively, it can be seen from the comparison between table 2 and table 3 that, when oxygen etching is adopted, and the ventilation time duration is 40 seconds, the residual amount of the ohmic contact layer 42 reaches 0.09178 microns; when the sulfur hexafluoride gas etching is adopted, and the ventilation time duration is 20 seconds, at this moment, the residual amount of the ohmic contact layer 42 reaches 0.0992 microns; by comparison, it can be found that, the sulfur hexafluoride gas etching may enable the residual amount of the ohmic contact layer 42 to reach the residual amount of the ohmic contact layer 42 under oxygen etching for 40 seconds in a short time, that is, an etching efficiency may be greatly improved through the sulfur hexafluoride gas etching, so that the production cost is further saved.

In one or more embodiments, between the step of arranging photoresist on the metal layer 5 and forming the non-exposure area A, the partial exposure area B and the full exposure area C, and the step of performing the first ashing treatment to remove the photoresist of the partial exposure area B and uncover the metal layer 5 corresponding to the partial exposure area B, the method of manufacturing array substrate further includes following steps of:

performing a wet etching treatment on the full exposure area C to etch off the metal layer 5 of the full exposure area C; and performing a dry etching treatment on the ohmic contact layer 42 of the completely uncovered region C to form a data line, a source electrode and a drain electrode.

In this way, the data line, the source electrode and the drain electrode may be formed on the substrate 1 through the wet etching and the dry etching. In this embodiment, the materials of the source electrode and the drain electrode may be selected from one or more of chromium, aluminum or copper, which is not solely limited herein.

Figure 8:
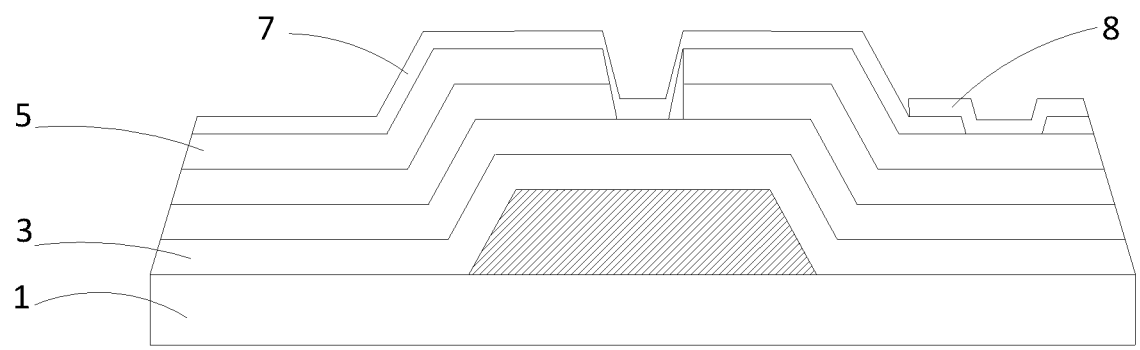
FIG. 8 illustrates a structural schematic diagram of deposition passivation layer and conductive thin film provided by an embodiment of the present disclosure.

In one or more embodiments, referring to FIG. 8, the step of performing the second ashing treatmen to etch off the residual photoresist corresponding to the metal layer recess area further includes a step of:

depositing a passivation layer 7 on the full exposure area C, and forming a via hole on the passivation layer 7 through dry etching.

Optionally, in this embodiment, a layer of passivation layer 7 is deposited by adopting a plasma enhanced chemical vapor deposition method, the passivation layer 7 is prepared from a silicon nitride material, in this way, the passivation layer 7 is prepared from the silicon nitride material, so that water vapor, sodium ions and oxygen impurities may be prevented from invading into the device. Of course, in this embodiment, the passivation layer 7 may also be prepared from other organic insulation materials, which is not solely limited herein.

In one or more embodiments, referring to FIG. 8, after the passivation layer 7 is deposited, the step of etching away the residual photoresist corresponding to the metal layer recess area further includes following steps of:

depositing a conductive thin film 8 on the passivation layer 7, and enabling the conductive thin film 8 to form a pixel electrode through dry etching, where the pixel electrode is electrically connected with the drain electrode through the via hole; and stripping the remaining photoresist.

Optionally, in this embodiment, a photoresist 6 is coated on the passivation layer 7, and after an ordinary mask is used to perform exposure and developing, a passivation layer recess (i.e., a pattern of via hole) is formed in a pixel area through a dry etching treatment, the passivation layer 7 in the passivation layer recess is completely etched away, so that a part of the drain electrode may be uncovered.

Optionally, in this embodiment, a conductive thin film 8 is deposited by adopting a magnetron sputtering method or a thermal evaporation method, the conductive film 8 may be made of indium tin oxide or indium zinc oxide; in this way, the pixel electrode is formed through dry etching, and the pixel electrode may be electrically connected with the drain electrode through the passivation layer recess. Finally, the residual photoresist 6 and the conductive thin film 8 covering the residual photoresist 6 are removed through a film peeling process, such that the conductive thin film 8 deposited in the passivation layer recess is reserved.

Optionally, both the aforesaid gate insulation layer 3 and the aforesaid semiconductor layer 4 are deposited on the substrate 1 through the chemical vapor deposition, and the metal layer 5 is deposited on the semiconductor layer 4 through the vapor deposition method.

Optionally, in this embodiment, the material of the aforesaid gate insulation layer 3 may be oxide, nitride or oxynitride and the like, in this embodiment, the gate insulation layer 3 may also be prepared from other materials, which is not solely limited herein.

The present disclosure further provides a method of manufacturing array substrate, the method of manufacturing array substrate is substantially the same as the method of manufacturing array substrate mentioned above; optionally, sulfur hexafluoride gas etching is applied in the first ashing treatment and in the second ashing treatment. In this way, the array substrate is manufactured by adopting the method of manufacturing array substrate mentioned above, such that the edge of the metal layer 5 may be guaranteed to be flush with the edge of the photoresist 6, and the ohmic contact layer 42 to be subsequently etched is flush with the edge of the metal layer 5, and a situation that the electrical property of the display panel is influenced by the size deviation which is due to unaligned edges is avoided.

Figure 9:
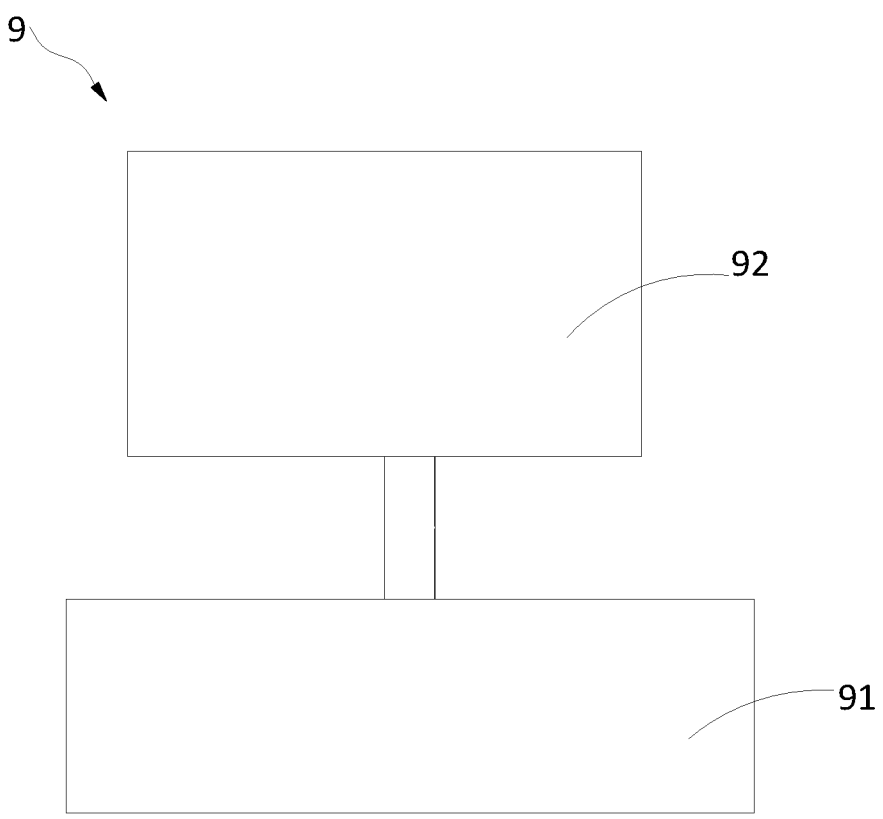
FIG. 9 illustrates a structural schematic diagram of a display panel provided by an embodiment of the present disclosure.

In this application, the present disclosure further provides a display panel, referring to FIG. 7 and FIG. 9, the display panel 9 includes an array substrate 91 and a color film substrate 92, where the array substrate 91 includes a substrate 1, a gate electrode 2, a gate insulation layer 3, a semiconductor layer 4, a metal layer 5 and a photoresist 6 which are sequentially stacked on the substrate 1, where a channel 60 is formed on the photoresist 6; at the same time, a metal layer recess 50 is formed in the metal layer 5, the metal layer recess 50 is communicated with the channel 60, and two side walls of the metal layer recess 50 are flush with two side walls of the channel 60. In this way, the semiconductor layer 4 is uncovered according to the arrangement of the metal layer recesss 50, so that the pattern of the TFT (Thin Film Transistor) channel region is formed; by arranging the two side walls of the metal layer recess 50 to be flush with the two side walls of the channel 60, the size deviation between the metal layer 5 and the photoresist 6 is reduced, so that the subsequent etching process is guaranteed, and aligning the subsequent semiconductor layer 4 with the metal layer 5 is implemented.

In the present disclosure, by adding the second ashing treatment before the dry etching, such that the size deviation between the metal layer 5 and the photoresist 6 may be reduced, aligning the edge of the ohmic contact layer 42 to be etched subsequently with the edge of the metal layer 5 may be guaranteed; in addition, the photoresist gas is used for etching the photoresist 6, etching the photoresist 6 excellently in a short time may be implemented, the production efficiency of etching is improved and the production cost is reduced.

The foregoing is only optional embodiments of the present disclosure and are not intended to limit the present disclosure. For ordinarily skilled one in the art, there may be various modifications and variations in the present disclosure. Any modification, equivalent replacement, improvement, and the like, which are made within the spirit and the principle of the present disclosure, should all be included in the protection scopes of the claims of the present disclosure.

What is claimed is:

1. A method of manufacturing array substrate, comprising steps of:
   sequentially forming a gate electrode, a gate insulation layer, a semiconductor layer and a metal layer on a substrate sequentially;
   coating a photoresist on the metal layer and forming an non-exposure area, a partial exposure area and a full exposure area through exposure and developing;
   performing a first ashing treatment to remove photoresist in the partial exposure area, and uncover the metal layer corresponding to the partial exposure area;
   performing a wet etching to the uncovered metal layer of the partial exposure area to form a metal layer recess and uncover the semiconductor layer, and some of residual photoresist in the metal layer recess being formed;
   performing a second ashing treatment to etch off the residual photoresist which remains in the metal layer recess after the first ashing treatment; and
   performing a dry etching to form a pattern of a thin film transistor channel region.

2. The method of manufacturing array substrate according to claim 1, wherein oxygen etching is applied in the second ashing treatment.

3. The method of manufacturing array substrate according to claim 1, wherein sulfur hexafluoride gas etching is applied in the second ashing treatment.

4. The method of manufacturing array substrate according to claim 1, wherein the semiconductor layer comprises a silicon-based thin film layer and an ohmic contact layer deposited on the silicon-based thin film layer.

5. The method of manufacturing array substrate according to claim 4, wherein the ohmic contact layer is deposited on the silicon-based thin film layer through a chemical vapor phase deposition method.

6. The method of manufacturing array substrate according to claim 4, wherein after the step of performing a second ashing treatment to etch off the residual photoresist corresponding to a metal layer recess area, the method further comprises a step of:
performing a dry etching to etch off the ohmic contact layer uncovered in the metal layer recess and uncover the silicon-based thin film layer to form the pattern of the thin film transistor channel region.

7. The method of manufacturing array substrate according to claim 6, further comprising steps of:
between the step of coating a photoresist on the metal layer and forming an non-exposure area, a partial exposure area and a full exposure area through exposure and developing, and the step of performing a first ashing treatment to remove the photoresist in the partial exposure area and uncover the metal layer corresponding to the partial exposure area;
applying the wet etching treatment to the full exposure area to etch off the metal layer of the full exposure area; and
applying a dry etching treatment to the ohmic contact layer of the full exposure area to form, a source electrode and a drain electrode.

8. The method of manufacturing array substrate according to claim 7, wherein the source electrode or the drain electrode is prepared from any one of materials of chromium, aluminum and copper.

9. The method of manufacturing array substrate according to claim 7, wherein the step of performing a second ashing treatment to etch off residual photoresist corresponding to a metal layer recess area further comprises a step of:
depositing a passivation layer in the full exposure area and forming a via hole on the passivation layer through dry etching.

10. The method of manufacturing array substrate according to claim 9, wherein the passivation layer is deposited in the full exposure area through a plasma enhanced chemical vapor deposition method.

11. The method of manufacturing array substrate according to claim 9, wherein the step of etching off residual photoresist corresponding to a metal layer recess area further comprises steps of:
after depositing the passivation layer;
depositing a conductive thin film on the passivation layer, and causing the conductive thin film to form a pixel electrode through dry etching, wherein the pixel electrode is electrically connected with the drain electrode through the via hole; and
stripping a remaining photoresist.

12. The method of manufacturing array substrate according to claim 11, wherein the conductive thin film is deposited on the passivation layer through a magnetron sputtering method or a thermal evaporation method.

13. The method of manufacturing array substrate according to claim 11, wherein the conductive thin film is prepared from any one of materials of indium tin oxide and indium zinc oxide.

14. The method of manufacturing array substrate according to claim 1, wherein the gate insulation layer and the semiconductor layer are deposited on the substrate sequentially through a chemical vapor deposition method, and the metal layer is deposited on the semiconductor layer through a physical vapor deposition method.

15. The method of manufacturing array substrate according to claim 14, wherein the gate insulation layer is made of oxide, nitride or oxynitride.

* * * * *